US011631624B2

(12) United States Patent
Setty et al.

(10) Patent No.: US 11,631,624 B2
(45) Date of Patent: Apr. 18, 2023

(54) SEMICONDUCTOR CHIP PACKAGE WITH SPRING BIASED LID

(71) Applicant: Advanced Micro Devices, Inc., Santa Clara, CA (US)

(72) Inventors: Kaushik Mysore Srinivasa Setty, Austin, TX (US); William J. Maxwell, Carrollton, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/216,201

(22) Filed: Dec. 11, 2018

(65) Prior Publication Data

US 2020/0185294 A1   Jun. 11, 2020

(51) Int. Cl.
*H01L 23/31* (2006.01)
*H01L 23/373* (2006.01)
*H01L 23/29* (2006.01)
*H01L 23/40* (2006.01)
*H01L 23/34* (2006.01)

(52) U.S. Cl.
CPC ........ *H01L 23/3114* (2013.01); *H01L 23/298* (2013.01); *H01L 23/34* (2013.01); *H01L 23/3737* (2013.01); *H01L 23/40* (2013.01)

(58) Field of Classification Search
CPC . H01L 23/3114; H01L 23/3737; H01L 23/40; H01L 23/34
USPC ................ 257/712, 713, 717, 718, E23.083; 438/117
See application file for complete search history.

(56) References Cited

U.S. PATENT DOCUMENTS

| | | | |
|---|---|---|---|
| 5,162,975 A * | 11/1992 | Matta | H01L 23/32 257/678 |
| 6,271,058 B1 | 8/2001 | Yoshida | |
| 6,501,658 B2 * | 12/2002 | Pearson | H01L 23/4093 174/16.3 |
| 6,512,675 B1 * | 1/2003 | Tarter | H01L 23/3675 174/15.1 |
| 6,622,786 B1 * | 9/2003 | Calmidi | F28F 3/022 165/122 |
| 6,939,742 B2 * | 9/2005 | Bhatia | H01L 23/4093 361/801 |
| 7,015,073 B2 | 3/2006 | Houle et al. | |
| 7,057,277 B2 | 6/2006 | Chen et al. | |
| 7,388,284 B1 | 6/2008 | Zhang | |
| 7,498,673 B2 * | 3/2009 | Awad | H01L 23/3675 257/718 |
| 8,362,609 B1 | 1/2013 | Dosdos et al. | |
| 2006/0202325 A1 * | 9/2006 | Coico | H01L 23/4006 257/718 |
| 2007/0045798 A1 | 3/2007 | Horie et al. | |

(Continued)

*Primary Examiner* — Nduka E Ojeh

(57) ABSTRACT

Various semiconductor chip packages are disclosed. In one aspect, a semiconductor chip package is provided that includes a package substrate that has a first edge and a second edge opposite to the first edge. A semiconductor chip is mounted on the package substrate. A thermal interface material is positioned on the semiconductor chip. A lid is positioned over the thermal interface material. A spring biasing mechanism is included that is operable to bias the lid away from the package substrate so that the lid, when subjected to a compressive force, can translate toward the package substrate and impart a compressive force on the thermal interface material.

13 Claims, 11 Drawing Sheets

(56) References Cited

U.S. PATENT DOCUMENTS

2011/0147916 A1 6/2011 Su
2012/0043669 A1* 2/2012 Refai-Ahmed ......... H01L 23/04
257/777

* cited by examiner

120
SEMICONDUCTOR CHIP PACKAGE WITH SPRING BIASED LID

BACKGROUND OF THE INVENTION

Many current integrated circuits are formed as multiple die on a common silicon wafer. After the basic process steps to form the circuits on the die are complete, the individual die are cut from the wafer. The cut die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder bumps are provided between the bond pads of the die and substrate interconnects to establish ohmic contact. An underfill material is deposited between the die and the substrate to act as a material that prevents damage to the solder bumps due to mismatches in the coefficients of thermal expansion between the die and the substrate. The substrate interconnects include an array of solder pads that are arranged to line up with the die solder bumps. After the die is seated on the substrate, a reflow process is performed to enable the solder bumps of the die to metallurgically link to the solder pads of the substrate. After the die is mounted to the substrate, a lid is attached to the substrate to cover the die. Some conventional integrated circuits, such as microprocessors, generate sizeable quantities of heat that must be ferried away to avoid device shutdown or damage. For these devices, the lid serves as both a protective cover and a heat transfer pathway.

One type of conventional lid is a so-called bathtub design, which includes a top wall and an integrally formed, but downwardly projecting, peripheral wall. The top wall engages a thermal interface material on the upper surface of the die. The peripheral wall is secured to the substrate by an adhesive bead.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
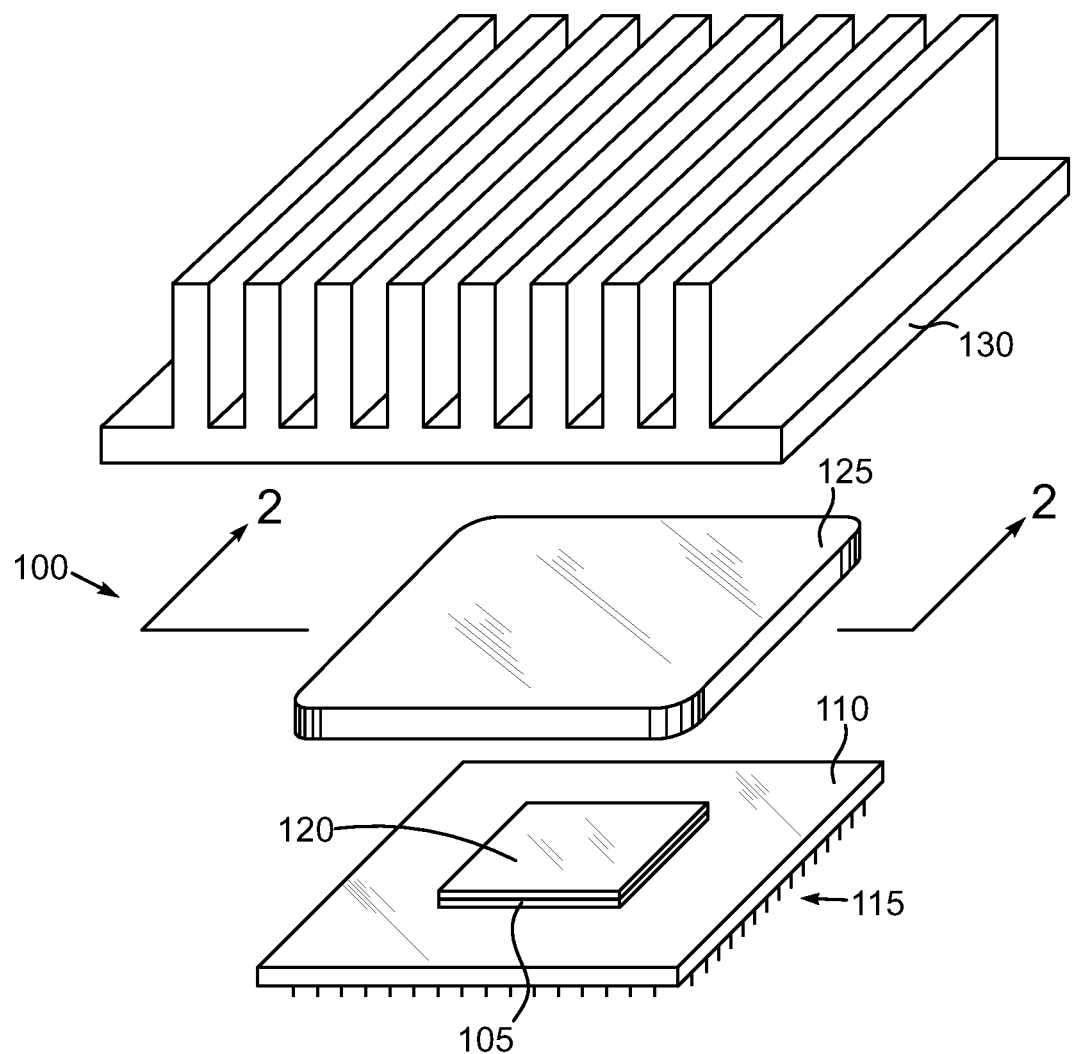
FIG. 1 is a partially exploded pictorial view of a conventional semiconductor chip package.

Conventional semiconductor chip packages that include a package substrate, a chip mounted on the substrate and a lid mounted on the package substrate and in thermal contact with the chip utilize an adhesive bead that creates a rigid interface between the package substrate and a downwardly projecting peripheral surface of the lid. The intent is to provide a rigid connection between the lid and the package such that the lid is not intended to translate relative to the package substrate. This conventional lid design does an excellent job of preventing relative motion between the lid and the substrate and thus provides a consistent engagement with a thermal interface material that is sandwiched between the chip and the lid. However, over time, whether the thermal interface material is composed of an organic material or a metallic material such as indium, due to repeated thermal cycling, the thermal interface material can begin to exhibit cracks, partial delaminations and/or voids between the opposing surfaces of the lid and the semiconductor chip. These defects increase the thermal resistance of the thermal interface material and thus can degrade the ability of the lid to transfer heat away from the semiconductor chip. One conventional solution to deal with the problem of thermal interface material degradation over time is to reduce the thermal output of the chip by way of reducing clock frequency and operating voltage. However, these techniques tend to decrease the computing performance of the chip, which is often an undesirable outcome. The disclosed new arrangements provide a semiconductor chip package that uses a variety of spring biasing mechanisms to allow a variety of lids to translate relative to an underlying semiconductor chip package substrate and thus impart a compressive force against an underlying thermal interface material, which can compress a thermal interface material from some uncompressed thickness to a reduced thickness and maintain a compressive force on the thermal interface material which can reduce the potential for defect formation and even close cracks or voids that have formed.

In accordance with one aspect of the present invention, a semiconductor chip package is provided that includes a package substrate, a semiconductor chip mounted on the package substrate, a thermal interface material positioned on the semiconductor chip, a lid positioned over the thermal interface material, and spring biasing mechanism operable to bias the lid away from the package substrate so that the lid, when subjected to a compressive force, can translate toward the package substrate and impart a compressive force on the thermal interface material.

In accordance with another aspect of the present invention, a semiconductor chip package is provided that includes a package substrate that has a first edge and a second edge opposite to the first edge. A semiconductor chip is mounted on the package substrate. A thermal interface material is positioned on the semiconductor chip. A lid is positioned over the thermal interface material. At least one spring is positioned on the package substrate between the first edge and the semiconductor chip and at least one spring is positioned on the package substrate between the second edge and the semiconductor chip. The at least one springs being operable to spring bias the lid away from the package substrate so that the lid, when subjected to a compressive force, can translate toward the package substrate and impart a compressive force on the thermal interface material.

In accordance with another aspect of the present invention, a method of manufacturing a semiconductor chip package is provided. The method includes mounting a semiconductor chip on a package substrate. The package substrate has a first edge and a second edge opposite to the first edge. The method also includes placing a thermal interface material on the semiconductor chip, placing a lid over the thermal interface material, and positioning at least one spring on the package substrate between the first edge and the semiconductor chip and at least one spring positioned on the package substrate between the second edge and the semiconductor chip. The at least one springs are operable to spring bias the lid away from the package substrate so that the lid, when subjected to a compressive force, can translate toward the package substrate and impart a compressive force on the thermal interface material.

In the drawings described below, reference numerals are generally repeated where identical elements appear in more than one figure. Turning now to the drawings, and in particular to FIG. 1 which is an exploded pictorial view of an exemplary conventional semiconductor chip package 100 that includes a semiconductor chip 105 mounted on a package substrate 110. In this particular arrangement, the package substrate 110 is a pin grid array package that includes plural downwardly projecting pins 115. The semiconductor chip 105 is topped with a thermal interface material (TIM) 120 composed of indium. A lid 125 is seated on the package substrate 110 and establishes a metallurgical bond with the indium TIM 120. In this illustrative arrangement, and as will be apparent in FIG. 2, the lid 125 is a bathtub design. A heat sink 130 is typically mounted on the lid 125 and clamped thereon with some type of clamping mechanism (not shown).

Figure 2:
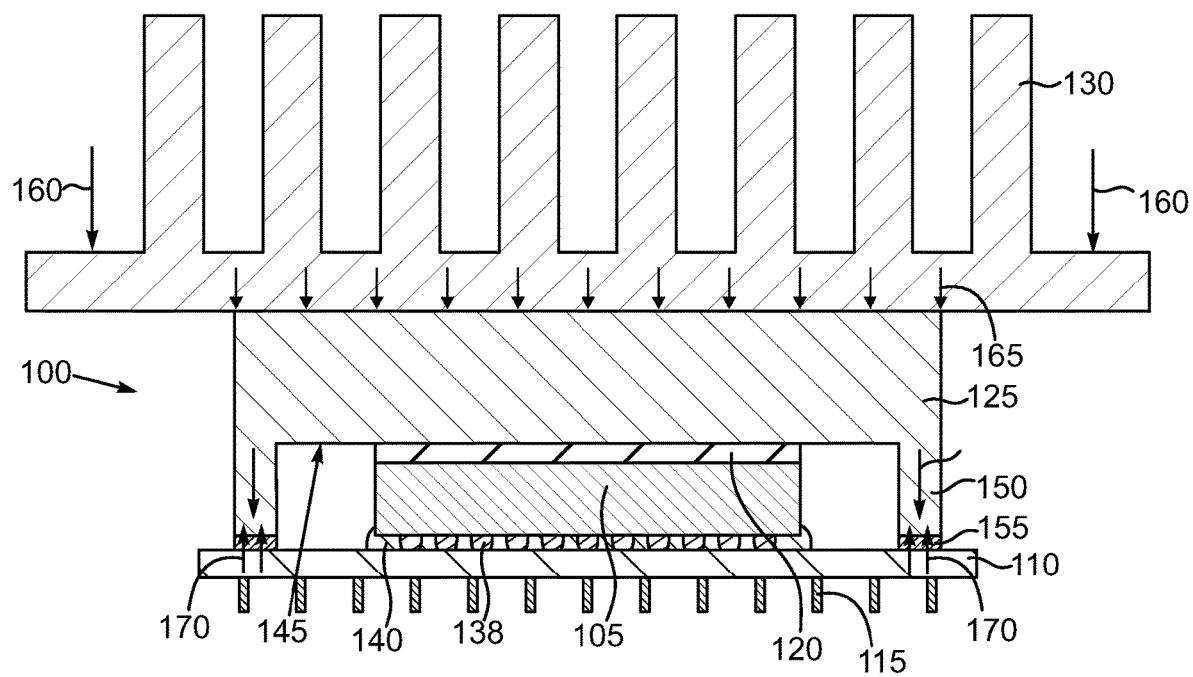
FIG. 2 is a sectional view of FIG. 1 taken at section 2-2.

Additional details of the conventional semiconductor chip package 100 and the heat sink 130 may be understood by referring now also to FIG. 2, which is a sectional view of FIG. 1 taken at section 2-2. The semiconductor chip 105 is flip chip connected to the package substrate 110 by way of plural solder interconnects 138, which are typically solder bumps. An underfill material 140 is interposed between the semiconductor chip 105 and the package substrate 110 to reduce some of the stresses caused by differences in coefficients of thermal expansion between the semiconductor chip 105 and the package substrate 110. As noted above, the indium TIM 120 establishes a metallurgical bond with the undersurface 145 of the lid 125. As noted above, the lid 125 in this conventional arrangement is a bathtub design that includes a downwardly projecting peripheral wall 150. The wall 150 is secured to the package substrate 110 by an adhesive bead 155, which is typically an epoxy adhesive. During assembly of the semiconductor chip package 100 but prior to mounting the heat sink 130 thereon, the indium TIM 120 is placed either on the surface 145 of the lid 125 or on the chip 105 as a preform and then the lid 125 is mounted on the package substrate 110 on the adhesive bead 155. At this point, one or more thermal cycles are imposed to both cure the adhesive bead 155 and to temporarily liquify the indium TIM 120 to establish the requisite metallurgical bond with the lid 125 during a subsequent cool down step. After the adhesive bead 155 is cured and the indium has solidified, the TIM 120 has a relatively fixed thickness $z_1$. Subsequently, the semiconductor chip package 100 is mounted in a socket of one type of another, and in this case a PGA socket, and the heat sink 130 is mounted thereon and a clamping force 160 is applied to the heat sink 130. The clamping force 160 produces a distributed compressive force 165 that bears on the lid 125. This distributive compressive force 165 is communicated down through the lid 125 and ultimately into the peripheral wall 150 where it is statically opposed by an upwardly projecting distributive compressive force 170 through the adhesive 155. Because the lid 125 is almost completely fixed with regard to the indium TIM 120 and the package substrate 110, the applied distributive force 165 produces very little compression of the indium TIM 120 and indeed may be on the order of just a couple of microns or less. Thus, the thickness $z_1$ of the TIM 120 does not change appreciably even after the application of the clamping force 160. A pit fall of this conventional arrangement is that, over time, voids (not shown) may form at the interface between the TIM 120 and the downward facing surface 145 of the lid 125. These voids can lead to greater thermal resistance and thus poor heat transfer performance and even result in delamination depending upon the quality of the interface between the TIM 120 and the surface 145.

Figure 3:
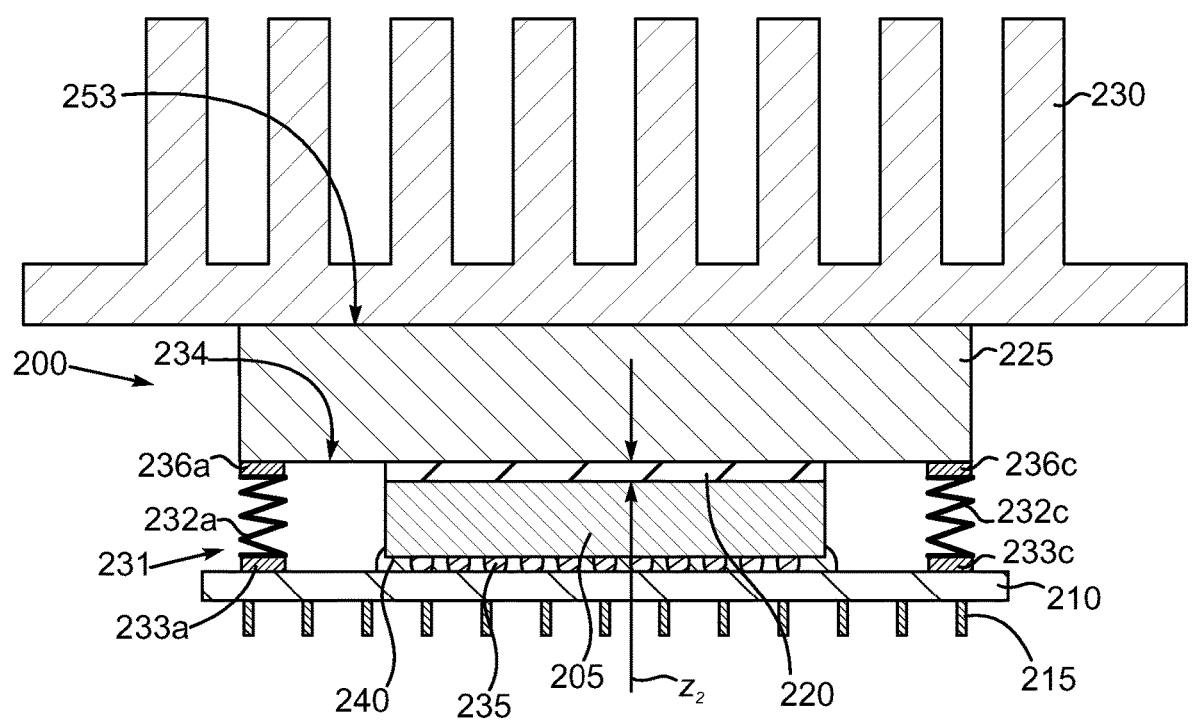
FIG. 3 is a sectional view like FIG. 2 but depicting an exemplary new arrangement of a semiconductor chip package.
Figure 4:
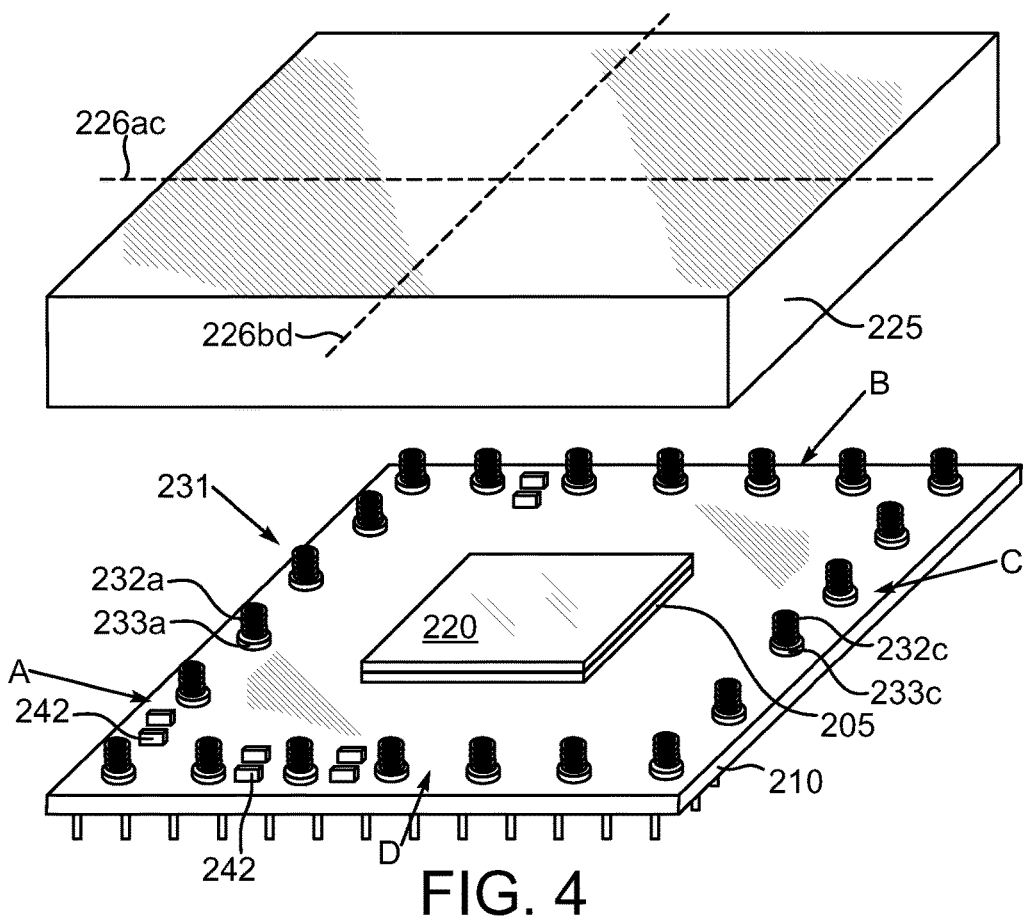
FIG. 4 is a partially exploded pictorial view of the new exemplary semiconductor chip package arrangement depicted in FIG. 3.

Attention is now turned to FIG. 3, which is a sectional view like FIG. 2, and to FIG. 4, which is a partially exploded pictorial view of an exemplary new arrangement of a semiconductor chip package 200 but without a heat sink shown. This illustrative arrangement of the semiconductor chip package 200 shares several general characteristics with the conventional semiconductor chip package 100 depicted in FIGS. 1 and 2 and described above. In particular, the semiconductor chip package 200 includes a semiconductor chip 205 mounted on a package substrate 210. In this and other disclosed exemplary arrangements, the semiconductor chip 205 can be virtually any type of integrated circuit and can number more than one. The package substrate 210 includes plural input/output pins 215, but could use other forms of I/Os, such as land grid arrays, ball grid arrays or others. In this and other disclosed exemplary arrangements, the package substrate 210 is preferably an organic buildup design, but could be monolithic, ceramic, prepreg or other designs. Note the four edges of the package substrate 210 are labeled A, B, C and D, respectively. A TIM 220 is interposed between the semiconductor chip 205 and a lid 225. The TIM 220 is advantageously composed of indium, but could alternatively be other types of solders, various organic materials, such as silicone with or without thermally conductive fillers or other types of TIMs. The lid 225 in this illustrative arrangement is a slab design constructed of nickel jacketed copper, but could be constructed of anodized aluminum, aluminum-silicon-carbide, aluminum nitride, boron nitride or the like. The lid 225 has two intersecting mid-lines 226ac and 226bd. If needed, a wetting film (not shown) composed of gold, platinum, palladium or the like can be applied between the lid 225 and the TIM 220 to facilitate metallurgical bonding during a reflow of the TIM 220. This will be useful where the TIM 220 is composed of metallic materials, such as indium or indium alloys. A heat sink 230 constructed of copper, aluminum, stainless steel or other thermally conductive materials or alloys is mounted on the lid 225 and compressed thereon by some type of clamping mechanism (not shown). However, in this illustrative arrangement, the lid 225 is connected to the package substrate 210 by a spring biasing mechanism 231 that is operable to bias the lid 225 away from the package substrate 210. In this illustrative arrangement, the spring biasing mechanism 231 includes one or more springs and in this case plural springs, two of which are visible in FIG. 2 and labeled 232a and 232c, respectively, and more of which are visible in FIG. 4, but not numbered. Note that the letters a and c in numbers 232a and 232c denote here, and in the other disclosed embodiments, the applicable edge A and C of the package substrate 210 where the springs 232a and 232c are positioned. Note that the spring(s) 232a are positioned between the edge A and the semiconductor chip 205 and the spring(s) 232c are positioned between the edge C and the semiconductor chip 205. Here, there are springs 232a, 232c, etc., positioned between the semiconductor chip 205 and all four edges A, B, C and D. However any two opposing edges, such as the edges A and C or B and D could receive the springs 232a, 232c, etc. and still provide acceptably symmetric loading. Symmetric loading is achieved by positioning opposite springs 232a and 232c approximately at the anticipated mid-line 226ac of the lid 225 or distributing the springs 232a symmetrically with respect to the mid-line 226ac along the edge A and vice versa for the springs 232c and the midline 226ac. Springs positioned between the edges B and D and the semiconductor chip 205 can be similarly symmetrically positioned relative to the mid-line 226bd. It should be understood the other disclosed arrangements can use symmetric loading placement of springs of the type just described.

The spring 232a is connected to the package substrate 210 by way of an adhesive 233a and to the underside 234 of the lid 225 by way of an adhesive 236a. The spring 232c is connected to the package substrate 210 by way of an adhesive 233c and to the underside 234 of the lid 225 by way of an adhesive 236c. Note that, as shown in FIG. 4, the adhesives 233a, 233c, etc., can be circular blobs. The same is true regarding the adhesives 236a and 236c, etc. Optionally, the adhesives 233a, 233c, 236a, etc. could be applied as a bead. In this illustrative arrangement, the springs 232a, 232c, etc., can be coil springs, however, and as will be apparent by the subsequent figures and discussion, the springs 232a, 232c, etc. can take on a variety of different configurations. The adhesives 233a, 236c, etc. can be any of a variety of well-known polymeric adhesives such as epoxies and other types of adhesives. Optionally, the adhesives 233a, 236c, etc. can be solders, either with or without lead content. In this illustrative arrangement, the semiconductor chip 205 is flip-chip mounted on the package substrate 210 connected thereto by way of plural interconnect structures 238, which may be solder bumps, micro bumps, conductive pillars or other types of interconnects. An underfill material 240 is interposed between the chip 205 and the package substrate 210 to alleviate issues of differential CTE.

During assembly of the semiconductor chip package 200, but prior to the mounting thereof in a socket and the clamping of the heat sink 230 thereon, the lid 225 is mounted on the TIM 220. At this point, the springs 232a, 232c, etc., can be pre-mounted to the under surface 234 of the lid 225 and then lowered on to the package substrate 210 as a combination or, the springs 232a, 232c, etc., can be pre-mounted to the package substrate 210 substrate by way of the adhesives 233a, 233c, etc., and thereafter the lid 225 will be dropped down on the springs 232a, 232c, etc., and secured thereto by the adhesives 236a, 236c, etc. Thereafter, the semiconductor chip package 200 is mounted in a socket (not shown) of one form or another such as a PGA or a LGA or even a BGA type of socket. At this point, the heat sink 230 is mounted on the lid 225 with or without another thermal interface material (not shown) at the interface 253 between the heat sink 230 and the lid 225. In any event, at this stage, the TIM 220 will have some initial pre-clamping thickness $z_2$. This initial pre-clamping thickness $z_2$ can be an uncompressed thickness or a thickness that is some amount of compression to achieve a desired initial thickness.

It should be noted that one of the advantages of using spaced-apart springs 232a, 232c, etc., in this and various of the disclosed exemplary arrangements, is that surface areas of the package substrate 210 that would ordinarily be covered by the lid 225 are free to be used to mount surface components, a few of which are depicted and collectively labeled 242. The surface components 242 can be capacitors, inductors, resistors, chiplets or other devices. By placing the components 242 proximate one or more of the edges A, B, C and/or D between adjacent springs 232a, 232c, etc., greater flexibility in the number of components 242 and conductor trace routing in the package substrate 210 can be achieved. Of course, some of the components 242 can be positioned between the chip 205 and the springs 232a, 232c, etc.

Figure 5:
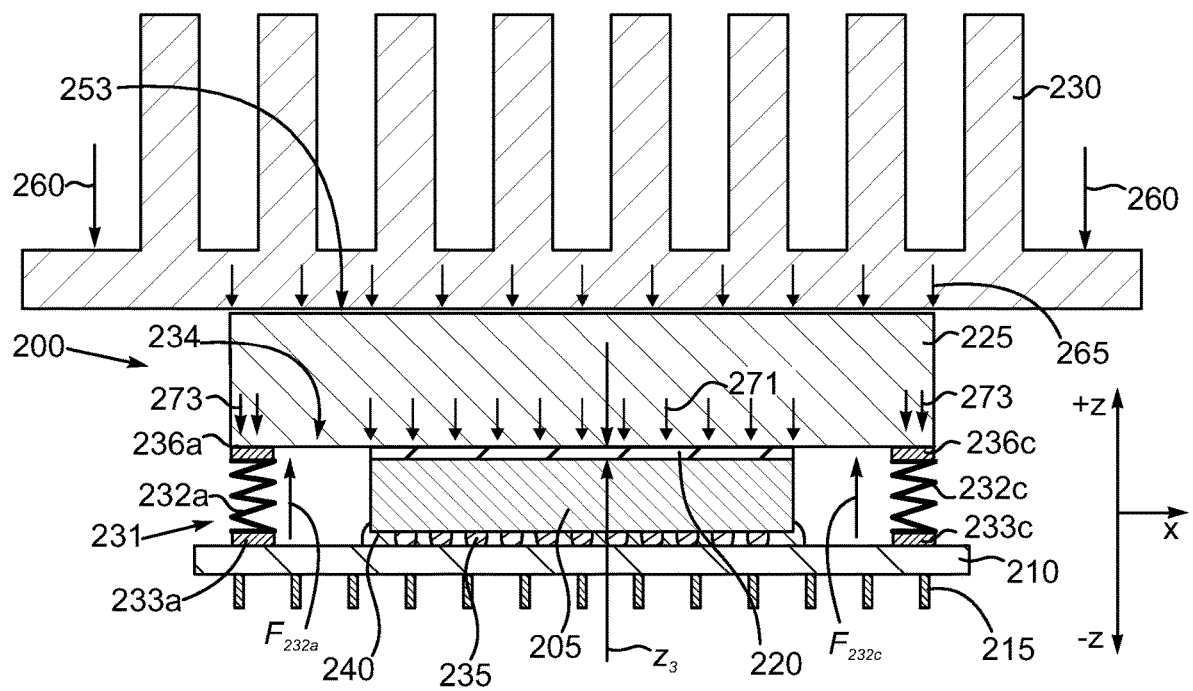
FIG. 5 is a sectional view like FIG. 3 but depicting force application to the lid of the exemplary semiconductor chip package arrangement.

The clamping of the heat sink 230 and movement of the lid 225 will now be described in conjunction with FIG. 5, which includes the same element numbering of structural components as FIG. 3A. A clamping force 260 is applied to the heat sink 230, which produces a distributed force 265 that bears against the lid 225. The distributive compressive force 265 is transferred into the lid 225. That distributive compressive force 265 then bifurcates into a distributive compressive force 271 that bears against the TIM 220 and a distributive compressive force 273 that bears against the springs 232a, 232c, etc. of the spring biasing mechanism 231 around the perimeter of the lid 225. The spring 232a provides an opposing force $F_{232a}$ in the +z direction against the lid 225, the spring 232c provides an opposing force $F_{232c}$ in the +z direction against the lid 225 and so on for the other unlabeled springs shown in FIG. 4. The opposing force $F_{232a}$ supplied by the spring 232a is given by:

$$F_{232a} = (k_{232a})(z) \qquad (1)$$

where $k_{232a}$ is the spring constant of the spring 232a and z is the amount of translation in the −z direction. The opposing forces of the other springs will be given by inserting the appropriate spring constant into Equation (1). Since the springs 232a, 232c, etc. act in parallel, the total force $F_{total}$ supplied by n (i.e., all of the) springs 232a, 232c, etc., is given by:

$$F_{total} = \Sigma_1^n k_n \cdot z \qquad (2)$$

In other words, the springs 232a, 232c, etc., can be replaced analytically by a single equivalent spring with a spring constant $k_{total}$ given by:

$$k_{total} = \Sigma_1^n k_n \qquad (3)$$

The number and individual spring constants of the springs 232a, 232c, etc., can be selected to provide a desired opposition force that, in combination with the applied clamping force 260, delivers a desired translation z of the lid 225 and thus compression of the TIM 220. Because of the springs 232a, 232c, etc. the lid 225 is able to translate in the −z direction some distance thereby compressing the TIM 220 to some post-clamping and compression thickness $z_3$. The amount of translation in the −z direction will be dependent upon the opposing upward force 275 supplied by the springs 232a, 232c, etc., as well as the magnitude of the distributed force 271 and the compressibility of the TIM 220. It is, however, anticipated that the post compression thickness $z_3$ of the TIM 220 will be on the order of 10 to 20 times greater than the compression of the conventional TIM 120 by the conventional lid 125 depicted in FIGS. 1 and 2. With this increased compression of the TIM 220, the TIM 220 is rendered thinner and thus provides less thermal resistance and the capability of allowing for void formation to be prevented or at least restricted. The springs 232a, 232c, etc., and those of the other disclosed embodiments, can be composed of a variety of different types of spring materials, such as, for example, stainless steel, brass, carbon steel, or the like.

Figure 6:
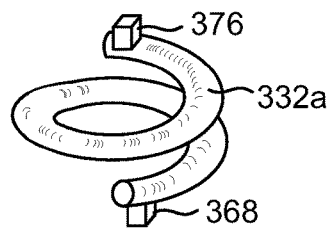
FIG. 6 is a pictorial view of an exemplary lid spring.

In the foregoing illustrative arrangement, the springs 232a, 232c, etc., can have relatively flat upper and lower surfaces to connect to the adhesives 233a, 233c, etc. In this way, the springs 232a, 232c, etc. can be configured somewhat like the springs that are typically used in an automobile strut, for example. However, it should be understood that mounting hardware can be fitted to springs used for the disclosed arrangements. In this regard, attention is now turned to FIG. 6, which is a pictorial view of an alternate exemplary spring 332a. Here, the spring 332a can be a coil spring but fitted with a lower mounting stud 368 and an upper mounting stud 376. The mounting studs 368 and 376 can be constructed of the same types of materials as the spring 332a or different types and connected thereto by way of solder, adhesives or other types of fastening techniques. The mounting studs 368 and 376 can provide a convenient way to solder mount the spring 332a to the various disclosed package substrates and lids or by way of adhesive.

Figure 7:
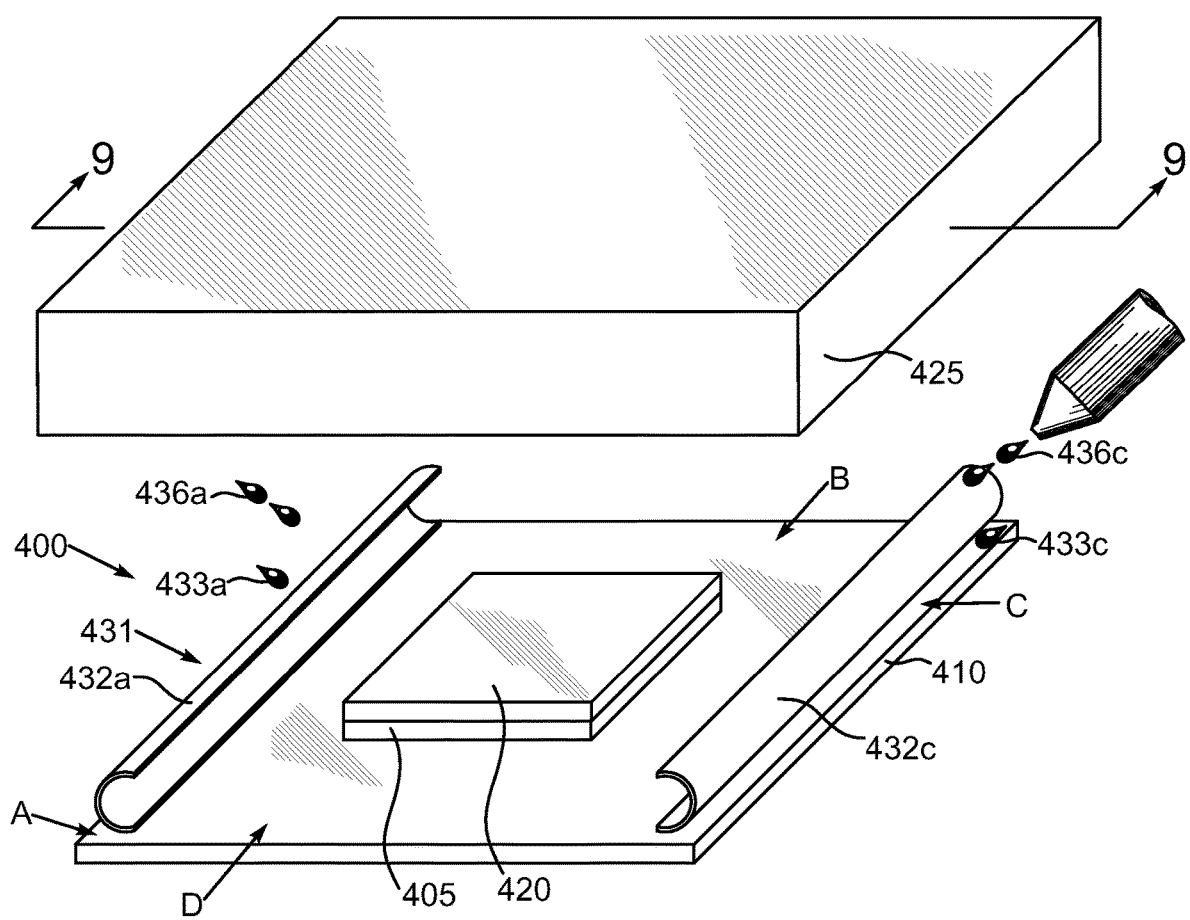
FIG. 7 is a partially exploded pictorial view of an alternate exemplary semiconductor chip package.

FIG. 7 is a partially exploded pictorial view of an alternate exemplary semiconductor chip package 400 that includes a semiconductor chip 405 mounted on a package substrate 410. A TIM 420 of the types disclosed elsewhere herein is positioned on the chip 405 and a lid 425 of the type disclosed elsewhere herein is mounted on the TIM 420 and thus the package 410 but in spring biased fashion. However, in this illustrative embodiment, in lieu of multiple coil springs, a spring biasing mechanism 431 includes an elongated c-spring 432a mounted on the package substrate 410 at the edge A and another c-spring 432c mounted at the edge C of the package substrate 410 opposite the spring 432a. Adhesives 433a, 436a, 433c and 436c can be applied to the lower and upper surfaces of the springs 432a and 432c to secure them to both the package substrate 410 and the lid 425. Of course it should be understood that similar c-springs (not shown) could be mounted at the edges B and D as well. The springs 432a and 432c are constructed with shapes and from materials that yield a desired spring constant and thus a desired amount of translation of the lid 425 and compression of the TIM 420 described above in conjunction with alternative arrangements.

Figure 8:
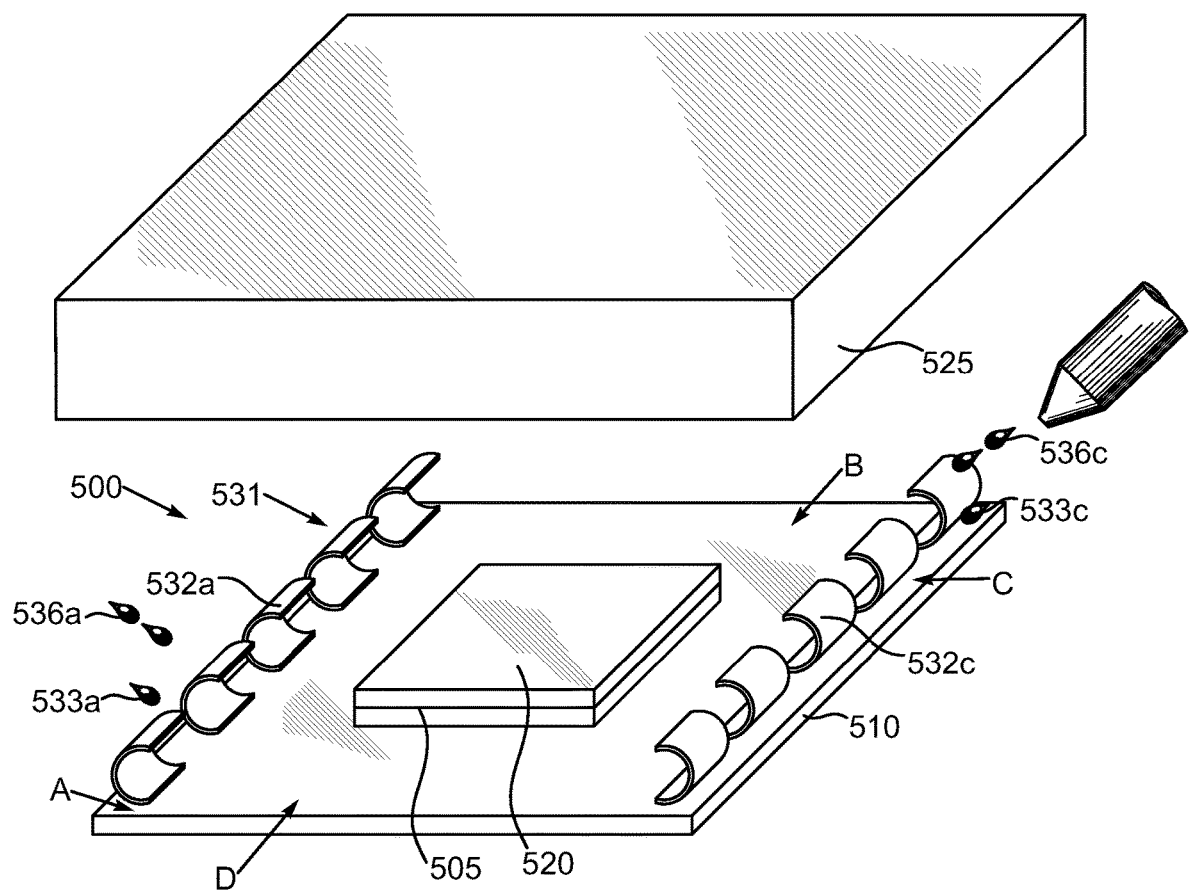
FIG. 8 is a partially exploded pictorial view of another alternate exemplary semiconductor chip package.

FIG. 8 depicts a partially exploded pictorial view like FIG. 7, but of an alternate exemplary semiconductor chip package 500. The semiconductor chip package 500 includes a semiconductor chip 505 mounted on a package substrate 510. A TIM 520 of the types disclosed elsewhere herein is positioned on the chip 505 and a lid 525 of the type disclosed elsewhere herein is mounted on the TIM 520 and thus the package 510 but in spring biased fashion. However, in this illustrative arrangement, a spring biasing mechanism 531 includes multiple spaced-apart c-springs 532a mounted on the edge A of the package substrate 510 and multiple spaced apart c-springs 532c mounted at the edge C of the package substrate 510 in lieu of the two elongated c-springs 432a and 432c shown in FIG. 7. Adhesives 533a, 536a, 533c and 536c can be applied to the lower and upper surfaces of the springs 532a and 532c and the other unlabeled to secure them to both the package substrate 510 and the lid 525. Of course it should be understood that similar c-springs (not shown) could be mounted at the edges B and D as well. The springs 532a and 532c are constructed with shapes and from materials that yield a desired spring constant and thus a desired amount of translation of the lid 525 and compression of the TIM 520 described above in conjunction with alternative arrangements.

Figure 9:
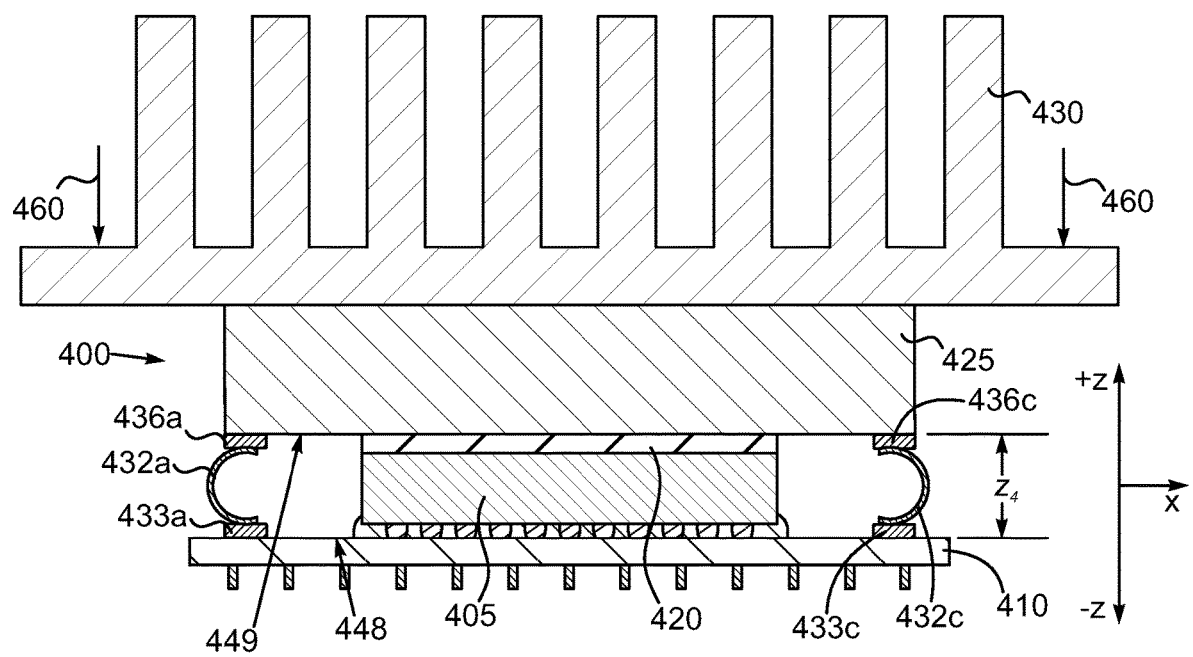
FIG. 9 is a sectional view of FIG. 7 taken at section 9-9.
Figure 10:
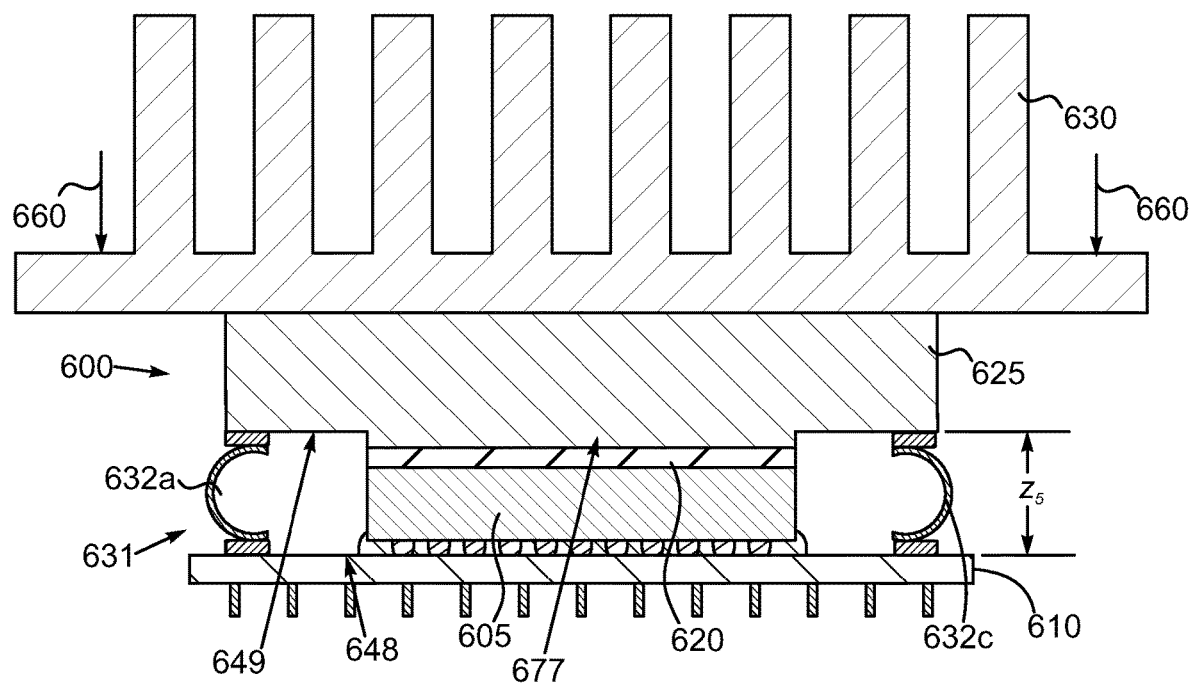
FIG. 10 is a sectional view like FIG. 9 but of an alternate exemplary semiconductor chip package.

Attention is turned again to FIG. 6, and also now to FIG. 9, which is a sectional view of FIG. 6 taken at section 9-9. FIG. 9 depicts the semiconductor chip package 400 assembled and with the heat sink 430 mounted thereon. When the clamping force 460 is imposed on the heat sink, the lid 425 will translate in the −z direction to some equilibrium point such that there is a gap $z_4$ between the lower surface 434 of the lid 425 and the upper surface 448 of the package 410. This gap $z_4$ is of course a function of the overall spring constant of the springs 432a and 432c, the resistance to compressive force of the TIM 420 and the amount of the applied clamping force 460 of among other things. In addition, the thicknesses of the adhesives 433a, 436a, 433c and 436c will also have a small impact on the value $z_4$. However, if it desired to use taller springs than the c-springs 432a and 432c then a different arrangement can be used such as that depicted in FIG. 10, which is a sectional view like FIG. 9. In this illustrative arrangement, a semiconductor chip package 600 utilizes a spring biasing mechanism 631 with opposing springs 632a and 632c, but these springs 632a and 632c can have a larger post compression z-height than the springs 432a and 432c depicted in FIG. 9. This greater compressed z-height can be both a function of the initial uncompressed height of the springs 632a and 632c and also the stiffness of the material used for the springs 632a and 632c. Thus, if the springs 632a and 632c have a lower spring constant than the springs 432a and 432c, then the post compression gap $z_5$ between the surface 648 of the package substrate 610 and the opposing surface 634 of the lid 625 can be bigger than the post compression height or gap $z_4$ shown in FIG. 9. However, in order to accommodate this greater post compression height or gap $z_5$, the lid 625 can be manufactured with a pedestal 677 to accommodate the taller springs 632a and 632c. This alternate type of lid 625 can be used with any of the disclosed arrangements.

Figure 11:
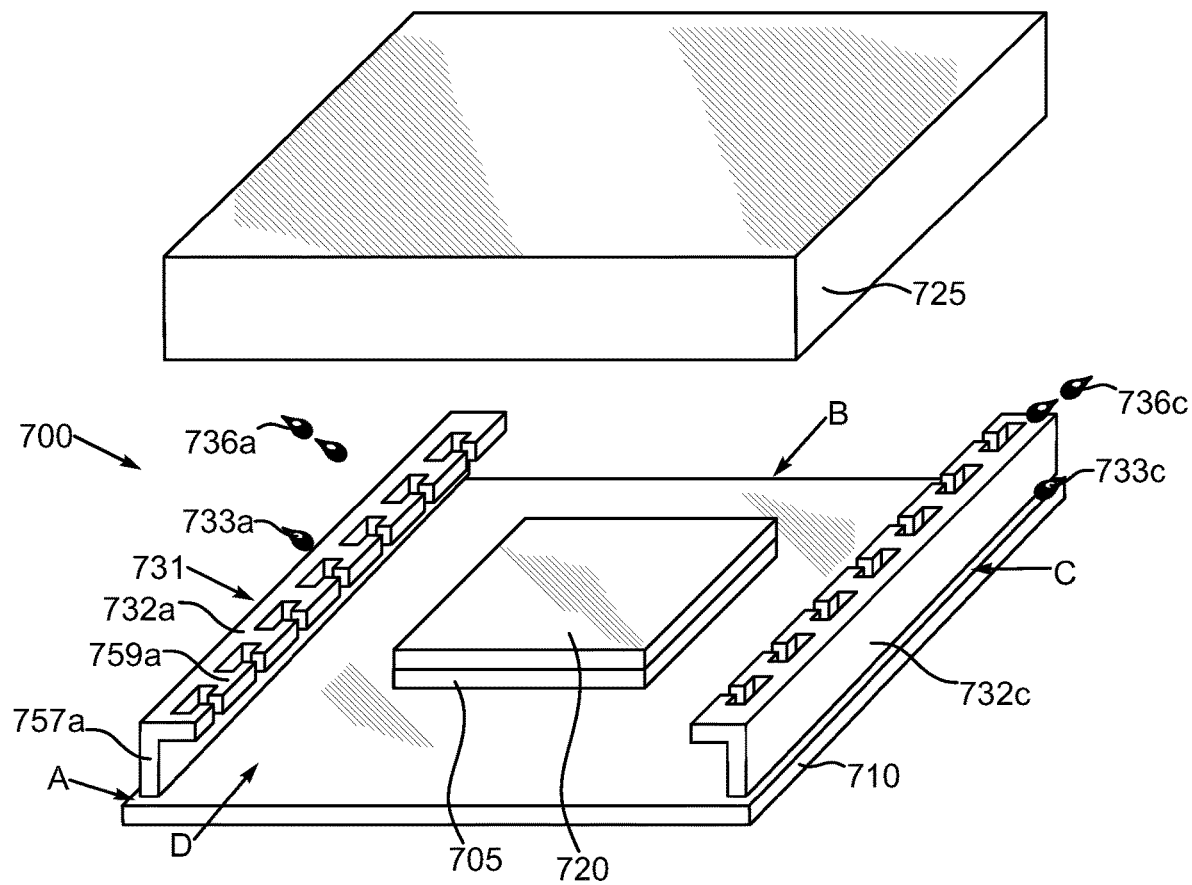
FIG. 11 is a partially exploded pictorial view of another alternate exemplary semiconductor chip package.

FIG. 11 is a partially exploded pictorially view of another alternate arrangement of a semiconductor chip package 700 that includes a semiconductor chip 705 mounted on a package substrate 710. A TIM 720 of the types disclosed elsewhere herein is positioned on the chip 705 and a lid 725 of the type disclosed elsewhere herein is mounted on the TIM 720 and thus the package 710 but in spring biased fashion. Here, in lieu of the other types of disclosed springs, a spring biasing mechanism 731 includes a cantilever spring 732a and another cantilever spring 732c can be mounted at the edges A and C respectively of the package substrate 710. The following discussion of the cantilever spring 732a will be illustrative of the cantilever spring 732c as well. The cantilever spring 732a can include an upwardly projecting wall 757 and plural cantilever members 759 connected thereto. Each of the cantilever members 759 can be a T-shaped design as disclosed or a straight piece or other type of shape as desired. The lid 725 should have some width that is appropriate so that the opposing edges of the lid 725 seat on the opposing cantilever member 759 of both the springs 732a and 732c. Again, the similar cantilever springs (not shown) could be mounted also on the edges B and D of the package 710 if desired. Of course, the cantilever springs 732a and 732c could be constructed with one or more cantilever members 759. Adhesives 733a, 736a, 733c and 736c can be applied to the lower and upper surfaces of the springs 732a and 732c to secure them to both the package substrate 710 and the lid 725.

Figure 12:
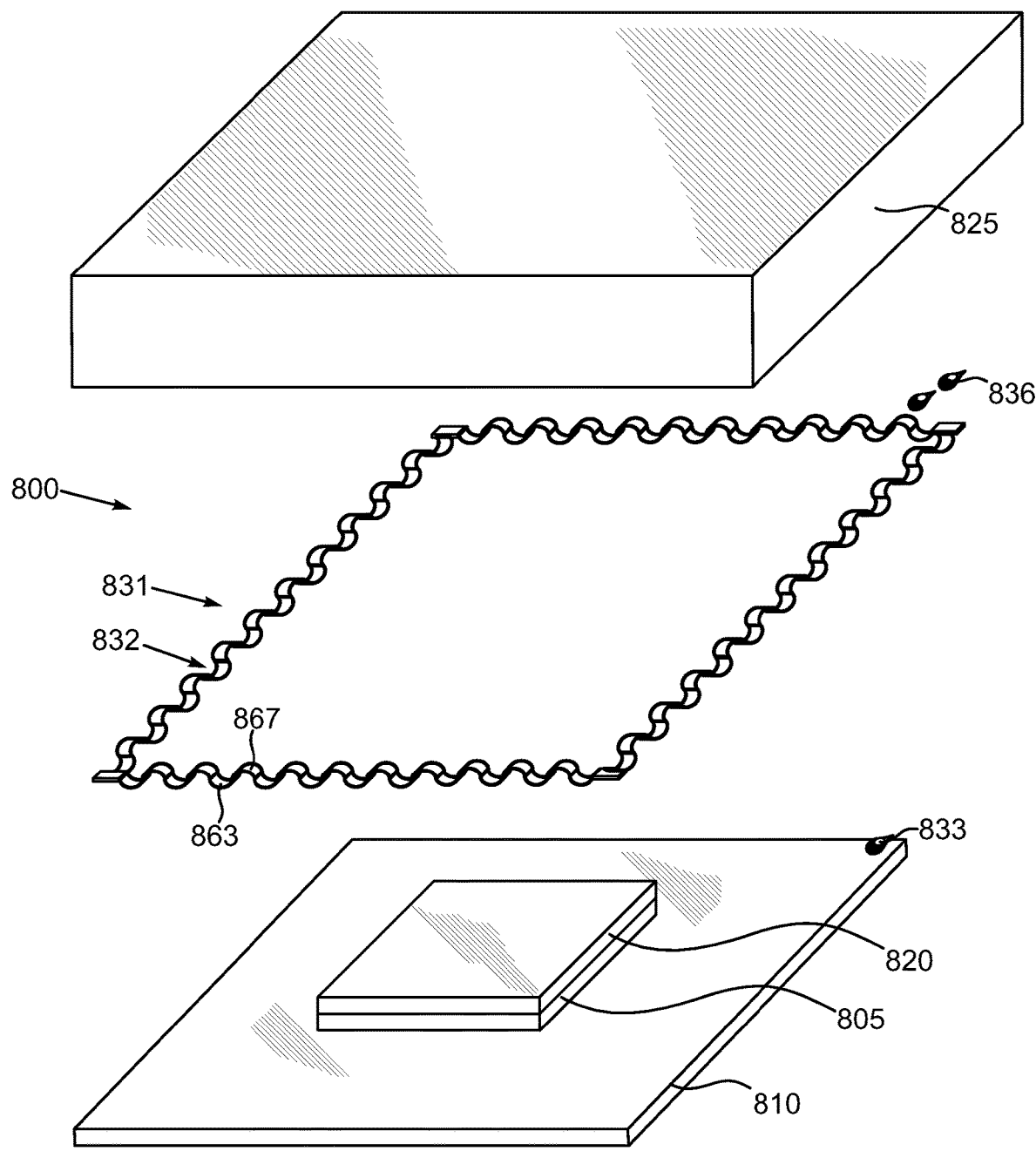
FIG. 12 is a partially exploded pictorial view of another alternate exemplary semiconductor chip package.

FIG. 12 is a partially exploded pictorial view of another exemplary semiconductor chip package 800 that includes a semiconductor chip 805 mounted on a package substrate 810. A TIM 820 of the types disclosed elsewhere herein is positioned on the chip 805 and a lid 825 of the type disclosed elsewhere herein is mounted on the TIM 820 and thus the package 810 but in spring biased fashion. Here, in lieu of multiple non-contiguous springs, a spring biasing mechanism 831 includes a single contiguous spring 832 mounted on the package substrate 810 to provide the requisite spring force to enable the lid 825 to translate vertically relative to the package substrate 810 during compressive force application. The spring 832 in this illustrative arrangement is a frame-like structure that has a generally sinusoidal configuration. Lower surfaces 863 and upper surfaces 867 of the spring 832 can be secured to the package substrate 810 and the lid 825, respectively, by way of adhesives 833 and 836 as disclosed elsewhere herein. Of course, other than sinusoidal patterns could be used.

Figure 13:
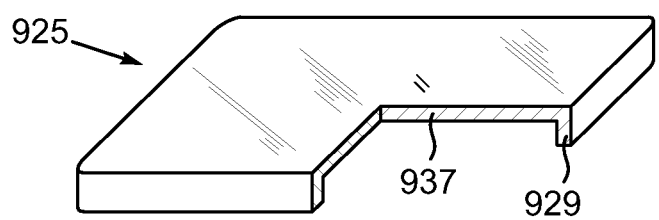
FIG. 13 is a quarter sectional view of an exemplary bathtub lid.
Figure 14:
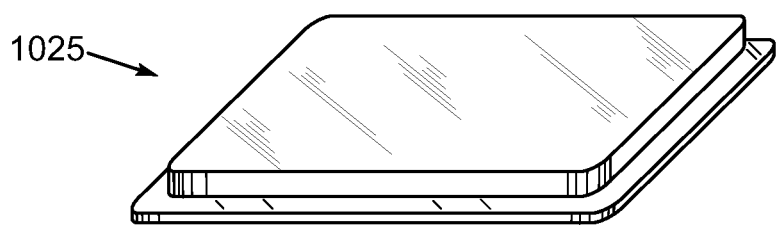
FIG. 14 is a pictorial view of an exemplary top hat lid.

As noted above, a variety of different types of lids can be used in a spring biased fashion as disclosed herein. For example, and as shown in FIG. 13, a lid 925 can be a bathtub design. FIG. 13 shows a quarter sectional view to reveal that the lid 925 has a downwardly projecting peripheral wall 929 and a top wall 937. In another alternate exemplary arrangement depicted pictorially in FIG. 14, a lid 1025 can be a top hat design as depicted.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor chip package, comprising:
   a package substrate;
   a semiconductor chip mounted on the package substrate;
   a thermal interface material positioned on the semiconductor chip;
   a lid positioned over the thermal interface material, the lid having a flat top surface operable to receive a heatsink; and
   a spring biasing mechanism extending along a majority portion of an edge of the package substrate and positioned between the package substrate and the lid operable to bias the lid away from the package substrate so that the lid, when subjected to a compressive force, can translate toward the package substrate and impart a compressive force on the thermal interface material.

2. The semiconductor chip package of claim 1, wherein the package substrate comprises a first edge and a second edge opposite to the first edge, the spring biasing mechanism comprises at least one first spring positioned between the first edge and the semiconductor chip and at least one second spring positioned between the second edge and the semiconductor chip.

3. The semiconductor chip package of claim 2, wherein the at least one spring positioned between the first edge and the semiconductor chip and the at least one spring positioned between the second edge and the semiconductor chip comprise cantilever springs.

4. The semiconductor chip package of claim 2, wherein the at least one first spring positioned between the first edge and the semiconductor chip and the at least one second spring positioned between the second edge and the semiconductor chip comprise c-springs.

5. The semiconductor chip package of claim 1, wherein the thermal interface material comprises a metallic material.

6. The semiconductor chip package of claim 1, wherein the thermal interface material comprises an organic material.

7. A semiconductor chip package, comprising:
   a package substrate having a first edge and a second edge opposite to the first edge;
   a semiconductor chip mounted on the package substrate;
   a thermal interface material positioned on the semiconductor chip;
   a lid positioned over the thermal interface material, the lid having a substantially flat top surface operable to receive a heatsink; and
   at least one first spring extending along a majority portion of the first edge of the package substrate and positioned on the package substrate between the first edge and the semiconductor chip and between the package substrate and the lid and at least one second spring extending along a majority portion of the second edge of the package substrate and positioned on the package substrate between the second edge and the semiconductor chip and between the package substrate and the lid, the at least one first and second spring being operable to spring bias the lid away from the package substrate so that the lid, when subjected to a compressive force, can translate toward the package substrate and impart a compressive force on the thermal interface material.

8. The semiconductor chip package of claim 7, wherein the at least one first spring positioned on the package substrate between the first edge and the semiconductor chip is connected to the at least one second spring positioned on the package substrate between the second edge and the semiconductor chip.

9. The semiconductor chip package of claim 7, wherein the at least one spring positioned between the first edge and the semiconductor chip and the at least one spring positioned between the second edge and the semiconductor chip comprise cantilever springs.

10. The semiconductor chip package of claim 7, wherein the at least one first spring positioned between the first edge and the semiconductor chip and the at least one second spring positioned between the second edge and the semiconductor chip comprise c-springs.

11. A method of manufacturing a semiconductor chip package, comprising:
   mounting a semiconductor chip on a package substrate, the package substrate having a first edge and a second edge opposite to the first edge;
   placing a thermal interface material on the semiconductor chip;
   placing a lid over the thermal interface material, the lid having a flat top surface operable to receive a heatsink; and
   positioning at least one first spring extending along a majority portion of the first edge of the package substrate between the first edge and the semiconductor chip and between the package substrate and the lid and at least one second spring extending along a majority portion of the second edge of the package substrate and positioned on the package substrate between the second edge and the semiconductor chip and between the package substrate and the lid, the at least one first and second spring being operable to spring bias the lid away from the package substrate so that the lid, when subjected to a compressive force, can translate toward the package substrate and impart a compressive force on the thermal interface material.

12. The method of claim 11, wherein the at least one first spring positioned on the package substrate between the first edge and the semiconductor chip is connected to the at least one second spring positioned on the package substrate between the second edge and the semiconductor chip.

13. The method of claim 11, wherein the at least one first spring positioned between the first edge and the semiconductor chip and the at least one second spring positioned between the second edge and the semiconductor chip comprise coil springs, cantilever springs or c-springs.

* * * * *